(12) United States Patent
Pu et al.

(10) Patent No.: US 6,828,665 B2
(45) Date of Patent: Dec. 7, 2004

(54) MODULE DEVICE OF STACKED SEMICONDUCTOR PACKAGES AND METHOD FOR FABRICATING THE SAME

(75) Inventors: Han-Ping Pu, Taichung (TW); Chih-Ming Huang, Taichung (TW); Chien-Ping Huang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/319,262

(22) Filed: Dec. 13, 2002

(65) Prior Publication Data

US 2004/0075164 A1 Apr. 22, 2004

(30) Foreign Application Priority Data

Oct. 18, 2002 (TW) ......................................... 91124044 A

(51) Int. Cl.[7] ................................................ H01L 23/02
(52) U.S. Cl. ........................ 257/686; 257/723; 438/107
(58) Field of Search ................................. 257/778, 686, 257/777, 723, 724, 787; 438/107, 110, 109

(56) References Cited

U.S. PATENT DOCUMENTS

| | | | | |
|---|---|---|---|---|
| 5,783,870 A | | 7/1998 | Mostafazadeh et al. ..... 257/791 |
| 5,854,507 A | * | 12/1998 | Mirmadi et al. | |
| 6,025,648 A | * | 2/2000 | Takahashi et al. | |
| 6,093,969 A | * | 7/2000 | Lin | |
| 6,303,997 B1 | | 10/2001 | Lee ............................. 257/778 |
| 6,472,735 B2 | * | 10/2002 | Isaak | |
| 6,483,718 B2 | * | 11/2002 | Hashimoto | |
| 6,583,503 B2 | * | 6/2003 | Akram et al. | |
| 6,590,282 B1 | * | 7/2003 | Wang et al. | |
| 6,600,222 B1 | * | 7/2003 | Levardo et al. | |

* cited by examiner

Primary Examiner—S. V. Clark
(74) Attorney, Agent, or Firm—Peter F. Corless; Steven M. Jensen; Edwards & Angell, LLP

(57) ABSTRACT

A module device of stacked semiconductor packages and a method for fabricating the module device are proposed, wherein a first semiconductor package provided, and at least a second semiconductor package is stacked on and electrically connected to the first semiconductor package. The first semiconductor package includes a chip carrier for mounting at least a chip thereon; a circuit board positioned above and electrically connected to the chip carrier by a plurality of conductive elements; and an encapsulant for encapsulating the chip, conductive elements and encapsulant with a top surface of the circuit board being exposed, allowing the second semiconductor package to be electrically connected to the exposed top surface of the circuit board. As the circuit board is incorporated in the first semiconductor package by means of the encapsulant, it provides preferably reliability and workability for electrically connecting the second semiconductor package to the first semiconductor package.

14 Claims, 5 Drawing Sheets

MODULE DEVICE OF STACKED SEMICONDUCTOR PACKAGES AND METHOD FOR FABRICATING THE SAME

FIELD OF THE INVENTION

The present invention relates to module devices of semiconductor packages, and more particularly, to a module device composed of a plurality of stacked semiconductor packages.

BACKGROUND OF THE INVENTION

Modern electronic products are developed toward requirements of multifunction, high electrical performance and high-speed operation, which can be complied by a multi chip module (MCM) semiconductor device incorporated with a plurality of chips.

A primary type of the MCM semiconductor device is to integrate a plurality of chips in a single semiconductor device. As shown in FIGS. 1a and 1b, a plurality of chips 11 are stacked on a substrate 10 (FIG. 1a), or a plurality of chips 21 are coplanarly mounted on a substrate 20 (FIG. 1b) in the MCM semiconductor device. This semiconductor device has a drawback that electrical and reliability tests can only be performed for the chips after completing the packaging or encapsulating process; in this case, if any chip fails in the tests, the whole semiconductor device fails to function and must be reworked or scraped, thereby increasing fabrication costs; this drawback is referred to as a KGD (known good die) problem.

As shown in FIG. 1c, U.S. Pat. No. 6,303,997 discloses another semiconductor device integrated with a plurality of chips in which a chip 31 and a semiconductor package 32 are mounted on and electrically connected to a substrate 30. During fabrication of the semiconductor device 3, the chip 31 is first electrically connected to an upper surface of the substrate 31 by bonding wires 311 and subject to tests. After the chip 31 is determined to properly function, the fabricated semiconductor package 32 is mounted to the substrate 30 by surface mount technology (SMT) and electrically connected to the substrate 30 via solder balls 321. Finally, the entire semiconductor device 3 is tested so as to solve the foregoing KGD problem of the above conventional MCM semiconductor device. However, a plurality of bond fingers and ball pads have to be formed on the upper surface of the substrate 30 in the semiconductor device 3, for use to electrically connect the chip 31 and semiconductor package 32 to the substrate 30. This not only restricts trace routability on the substrate 30, but also requires high-density fabrication processes for making build-up substrates, thereby undesirably increasing fabrication costs.

U.S. Pat. No. 5,783,870 discloses a further example of a semiconductor device incorporated with a plurality of chips in which a plurality of semiconductor packages are integrated to form a single module semiconductor device. As shown in FIG. 1d, this module semiconductor device 4 allows a second semiconductor package 40b to be stacked on a first semiconductor package 40a, wherein the second semiconductor package 40b is attached and electrically connected via its plurality of solder balls 411b to an upper surface of a substrate 41a of the first semiconductor package 40a, and a third semiconductor package 40c is stacked in a similar way on the second semiconductor package 40b. In this module semiconductor device, each semiconductor package can be individually subject to required tests; after passing the tests, the semiconductor packages are then stacked on each other; further, the module semiconductor device uses conventional substrates to solve the KGD problem usually encountered by the MCM device. However, in the package-stack structure of the module semiconductor device, an upper semiconductor package can only be mounted and electrically connected to a substrate of a lower semiconductor package at area outside a chip attach region for accommodating a chip in the lower semiconductor package; that is, the electrically-connecting area on the substrate of the lower semiconductor package is limited and thus affects trace routability of the substrate, whereby quantity and arrangement of input/output (I/O) connections of the upper semiconductor package would also be restricted, thereby adversely affecting design flexibility of the entire semiconductor device.

Therefore, the problem to be solved herein is to improve integration of a semiconductor device through the use of simple fabrication processes and reduced fabrication costs.

SUMMARY OF THE INVENTION

A primary objective of the present invention is to provide a module device composed of a plurality of stacked semiconductor packages and a method for fabricating the module device, so as to enhance reliability and workability for fabrication of the module device.

Another objective of the invention is to provide a module device composed of a plurality of stacked semiconductor packages and a method for fabricating the module device, so as to reduce complexity of fabrication processes and production costs for the module device.

A further objective of the invention is to provide a module device composed of a plurality of stacked semiconductor packages and a method for fabricating the module device, so as to improve trace routability and design flexibility of the module device for incorporating a plurality of semiconductor packages in the module device.

In accordance with the foregoing and other objectives, the present invention proposes a module device composed of a plurality of stacked semiconductor packages, comprising: a first semiconductor package; and at least a second semiconductor package stacked on and electrically connected to the first semiconductor package.

The first semiconductor package comprises: a chip carrier; at least a chip mounted on the chip carrier; a plurality of first conductive elements for electrically connecting the chip to the chip carrier; a circuit board having a top surface and a bottom surface, and mounted above the chip; a plurality of second conductive elements disposed on the bottom surface of the circuit board, for supporting and electrically connecting the circuit board to the chip carrier; an encapsulant formed between the chip carrier and the circuit board, for encapsulating the chip and the first and second conductive elements, allowing the top surface of the circuit board to be exposed to outside of the encapsulant; and a plurality of third conductive elements for electrically connecting the chip to an external device.

The second semiconductor package is electrically connected to the exposed top surface of the circuit board of the first semiconductor package by means of the first conductive elements, and integrated with the first semiconductor package to thereby form a module device of stacked semiconductor packages.

A method for fabricating the module device according to the invention comprises the steps of: preparing a chip carrier and mounting at least a chip on the chip carrier, allowing the chip to be electrically connected to the chip carrier by a plurality of first conductive elements; providing a circuit board having a top surface and a bottom surface, and formed a plurality of second conductive elements on the bottom surface of the circuit board; mounting the circuit board above the chip carrier incorporated with the chip, and electrically connecting the circuit board to the chip carrier by the second conductive elements; forming an encapsulant between the chip carrier and the circuit board for encapsulating the chip and the first and second conductive elements, allowing the top surface of the circuit board to be exposed to outside of the encapsulant, so as to fabricate a first semiconductor package; mounting a plurality of third conductive elements on the chip carrier, for electrically connecting the first semiconductor package to an external device; and electrically connecting at least a second semiconductor package to the top surface of the circuit board of the first semiconductor package.

With the circuit board being incorporated in the first semiconductor package by means of the second conductive elements and the encapsulant formed between the circuit board and the chip carrier, it provides preferable reliability and workability for electrically connecting the second semiconductor package to the first semiconductor package. Moreover, the top surface of the circuit board exposed to outside of the first semiconductor package or encapsulant can be entirely used for mounting the second semiconductor package thereon, thereby improving trace routability or layout for accommodating more electronic elements.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1A:
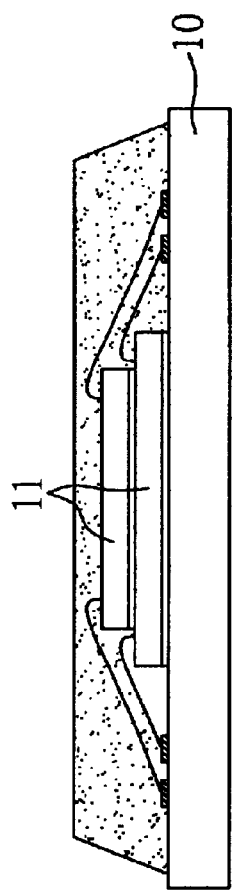
FIG. 1a (PRIOR ART) is a cross-sectional view of a conventional semiconductor package incorporated with a plurality of chips.
Figure 1B:
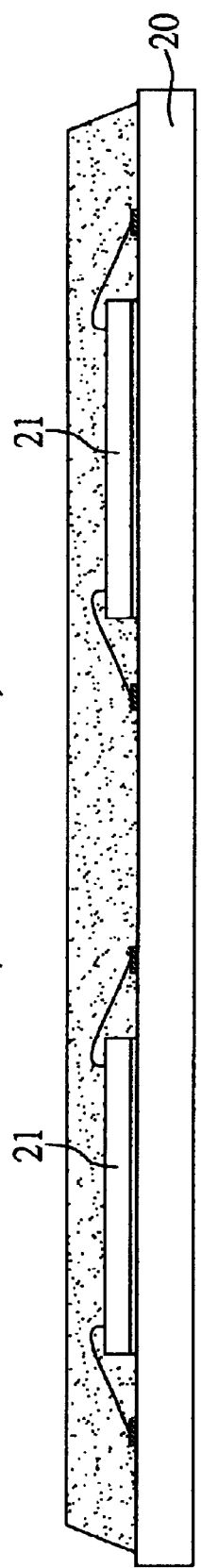
FIG. 1b (PRIOR ART) is a cross-sectional view of another conventional semiconductor package incorporated with a plurality of chips.
Figure 1C:
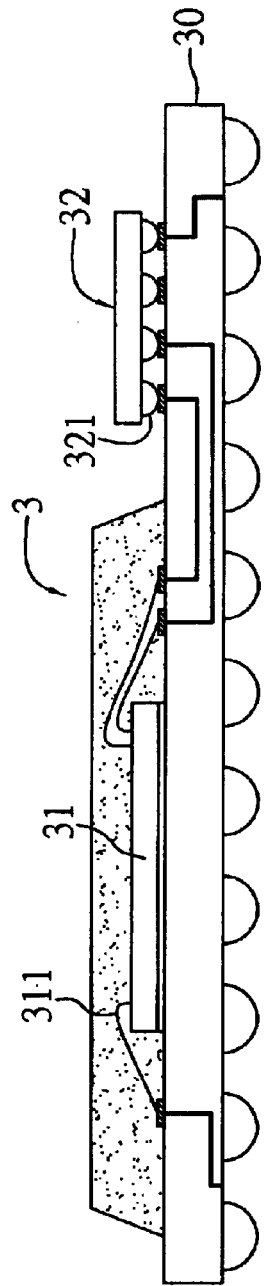
FIG. 1c (PRIOR ART) is a cross-sectional view of a conventional semiconductor package disclosed in U.S. Pat. No. 6,303,997.
Figure 1D:
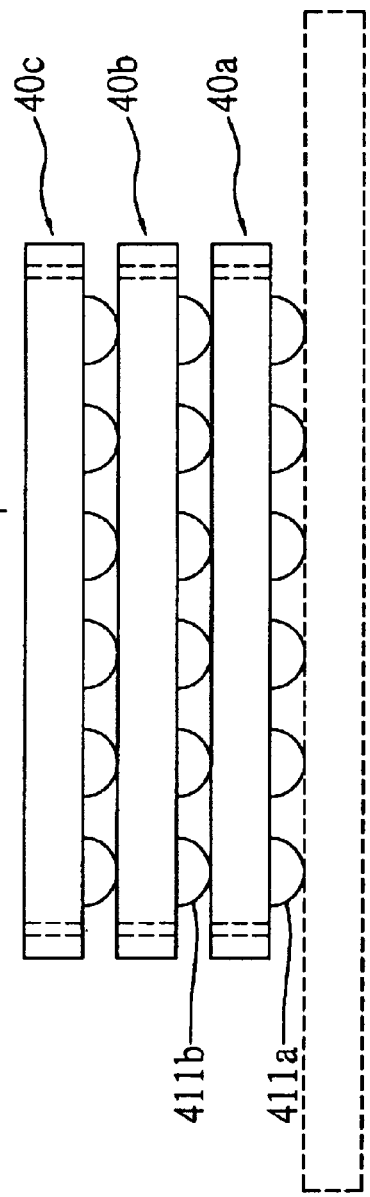
FIG. 1d (PRIOR ART) is a cross-sectional view of a conventional semiconductor package disclosed in U.S. Pat. No. 5,783,870.
Figure 2A:
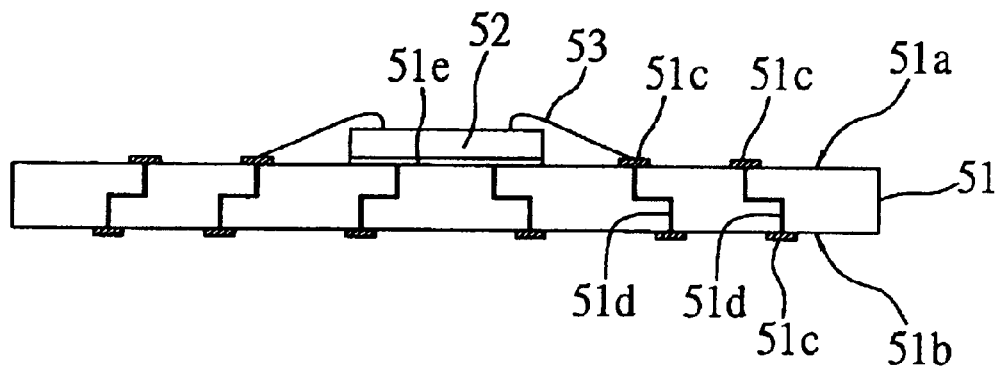
FIGS. 2a–2e are schematic diagrams showing fabrication processes for a module device of stacked semiconductor packages according to a first preferred embodiment of the invention.
Figure 2B:
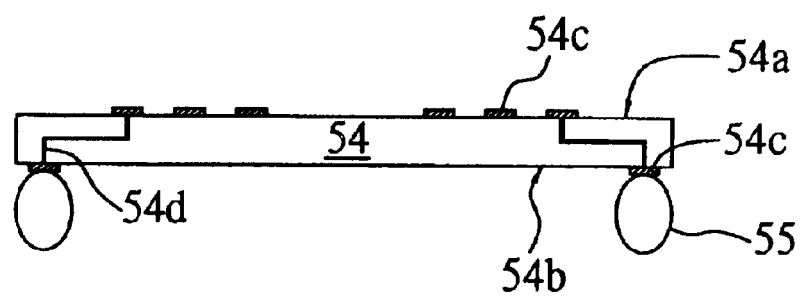
Figure 2C:
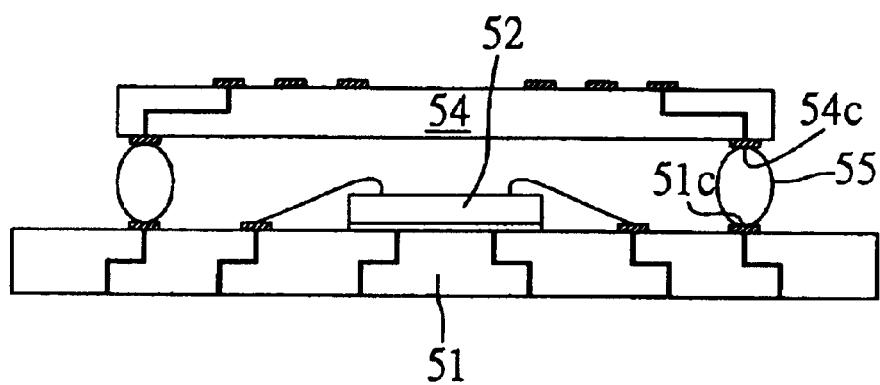
Figure 2D:
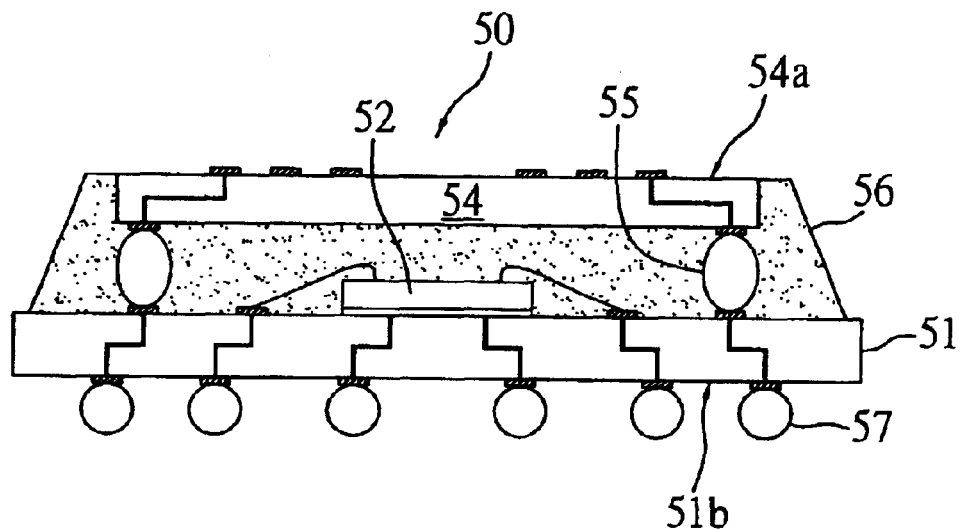
Figure 2E:
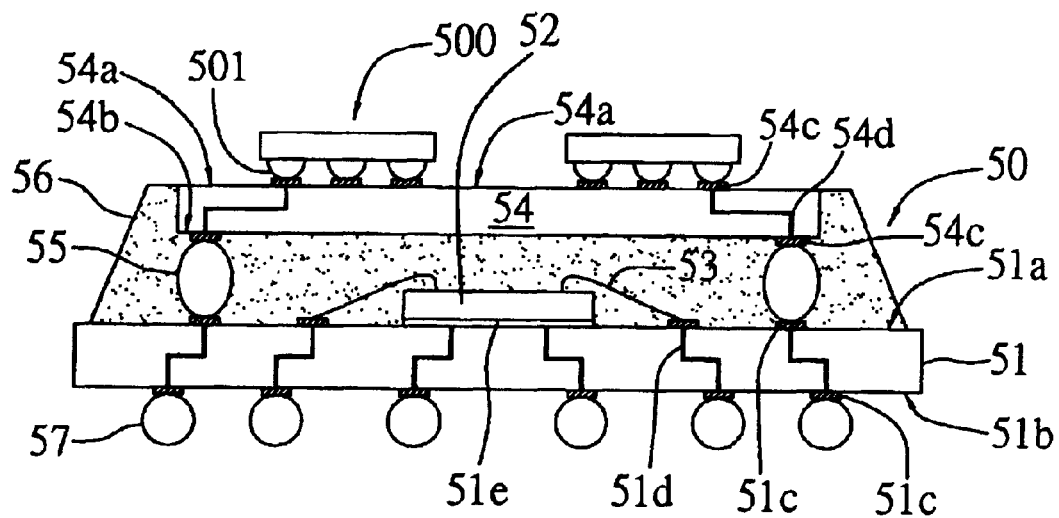

Referring to FIG. 2e that illustrates a cross-sectional view of a module device of stacked semiconductor packages according to the present invention.

As shown in FIG. 2e, the module device comprises a first semiconductor package 50; and at least a second semiconductor package 500 stacked on and electrically connected to the first semiconductor package 50.

The first semiconductor package 50 has a chip carrier 51; at least a chip 52 mounted on the chip carrier 51; a plurality of first conductive elements 53 for electrically connecting the chip 52 to the chip carrier 51; a circuit board 54 mounted above the chip 52; a plurality of second conductive elements 55 for supporting and electrically connecting the circuit board 54 to the chip carrier 51; an encapsulant 56 formed between the chip carrier 51 and the circuit board 54, for encapsulating the chip 52 and the first and second conductive elements 53, 55, allowing a top surface of the circuit board 54 to be exposed to outside of the encapsulant 56; and a plurality of third conductive elements 57 for electrically connecting the first semiconductor package 50 to an external device (not shown). The exposed top surface of the circuit board 54 is used to be electrically connected with the second semiconductor package 500, so as to integrate the first semiconductor package 50 and the second semiconductor package 500 to form a module device of stacked semiconductor packages.

The chip carrier 51 is a BGA (ball grid array) substrate and has a first surface 51a and a second surface 51b, wherein a plurality of electrical contacts 51c and conductive traces (not shown) are formed on the first and second surfaces 51a, 51b of the chip carrier 51, and a plurality of conductive vias 51d are formed through the chip carrier 51. The chip 52 is mounted on the chip carrier 51 via an adhesive 51e such as silver paste and electrically connected to the chip carrier 51 by means of the first conductive elements 53 such as gold wires.

The circuit board 54 has a top surface 54a and a bottom surface 54b, wherein a plurality of electrical contacts 54c and conductive traces (not shown) are formed on the top and bottom surfaces 54a, 54b of the circuit board 54, and a plurality of conductive vias 54d are formed through the circuit board 54. The second conductive elements 55 such as solder balls, solder bumps or metal pins are bonded to the electrical contacts 54c on the bottom surface 54b of the circuit board 54, so as to allow the circuit board 54 to be mounted above the chip carrier 51 incorporated with the chip 52 and electrically connected to the chip carrier 51 by reflowing the second conductive elements 55 to corresponding electrical contacts 51c on the first surface 51a of the chip carrier 51; the second conductive elements 55 support and prevent the circuit board 54 from coming into contact or short-circuiting with the chip 52 or first conductive elements 53.

The encapsulant 56 is formed by injecting a resin material such as epoxy resin into a gap between the chip carrier 51 and the circuit board 54, for encapsulating the chip 52 and the second conductive elements 55, allowing the top surface 54a of the circuit board 54 to be exposed to outside of the encapsulant 56.

The third conductive elements 57 are arranged as a ball grid array (BGA) and implanted on the second surface 51b of the chip carrier 51, for electrically connecting the first semiconductor package 50 to an external device such as printed circuit board (PCB, not shown). This thereby completes fabrication of the first semiconductor package 50 having the circuit board 54 with the top surface 54a of the circuit board 54 being exposed to outside of the encapsulant 56.

The second semiconductor package 500 is a BGA semiconductor package; after being packaged and tested successfully to verify proper functionality, the second semiconductor package 500 is mounted via its ball grid array 501 to the top surface 54a of the circuit board 54 by surface mount technology (SMT), to thereby stack the second semiconductor package 500 on the first semiconductor package 50.

FIGS. 2a to 2e illustrate schematic diagrams of fabrication processes for a module device of stacked semiconductor packages according to a first preferred embodiment of the invention. The module device according to the invention can be fabricated by the following process steps. Referring to FIG. 2a, the first step is to prepare a chip carrier 51 such as a BGA substrate, and mount and electrically connect at least a chip 52 to the chip carrier 51. This chip carrier or substrate 51 can be made of a resin material such as epoxy resin, polyimide resin, BT (bismaleimide triazine) resin, FR4 resin, etc. The chip carrier 51 has a first surface 51a and a second surface 51b, wherein a plurality of electrical contacts 51c and conductive traces (not shown) are formed on the first and second surfaces 51a, 51b of the chip carrier 51, and a plurality of conductive vias 51d are formed through the chip carrier 51. The chip 52 is mounted on the chip carrier 51 via an adhesive 51e such as silver paste and electrically connected to the chip carrier 51 by a plurality of first conductive elements 53 such as gold wires.

The electrical contacts 51c are fabricated by pre-forming a conductive layer (not shown) such as a copper layer over each of the first and second surfaces 51a, 51b of the chip carrier 51 and then selectively removing predetermined portions of the conductive layer to form the electrical contacts 51c.

Referring to FIG. 2b, the next step is to provide a circuit board 54 having a top surface 54a and a bottom surface 54b, wherein a plurality of electrical contacts 54c and conductive traces (not shown) are formed on the top and bottom surfaces 54a, 54b of the circuit board 54, and a plurality of conductive vias 54d are formed through the circuit board 54. A plurality of second conductive elements 55 such as solder balls, solder bumps or metal pins are bonded to the electrical contacts 54c on the bottom surface 54b of the circuit board 54.

Referring to FIG. 2c, an encapsulation or molding process is performed to fill a resin material such as epoxy resin into a gap between the chip carrier 51 and the circuit board 54 to form an encapsulant 56 that encapsulates the chip 52 and the second conductive elements 55, allowing the top surface 54a of the circuit board 54 to be exposed to outside of the encapsulant 56. Then, a plurality of third conductive elements 57 such as solder balls are implanted on the second surface 51b of the chip carrier 51, for electrically connecting the chip 52 to an external printed circuit board (PCB, not shown). This thereby completes fabrication of a first semiconductor package 50 having the circuit board 54 with the top surface 54a of the circuit board 54 being exposed to outside of the encapsulant 56.

Finally, referring to FIG. 2e, at least a second fabricated and tested semiconductor package 500 is mounted via its ball grid array 501 to the top surface 54a of the circuit board 54 by surface mount technology (SMT), to thereby stack the second semiconductor package 500 on the first semiconductor package 50 so as to form the module device according to the invention.

In the module device of stacked semiconductor packages according to the invention, the circuit board 54 is used to stack the second semiconductor package 500 on the first semiconductor package 50, and incorporated in the first semiconductor package 50 by means of the encapsulant 56, to thereby provide preferable reliability and workability for electrically connecting the second semiconductor package 500 to the first semiconductor package 50. Further, the top surface 54a of the circuit board 54 is exposed to outside of the first semiconductor package 50 and entirely used for accommodating the second semiconductor package 500, thereby improving trace routability or layout for accommodating more electronic elements. Moreover, substrates used in the first and second semiconductor packages 50, 500 are commonly-used conventional substrates, such that stacking of semiconductor packages can be easily achieved without having to adopt additional complex fabrication processes and costs.

Figure 3:
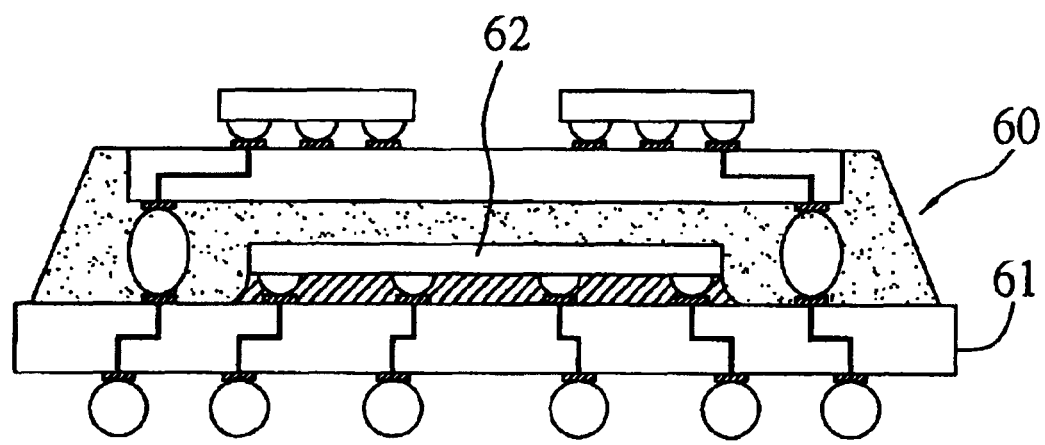
FIG. 3 is a cross-sectional view of a module device of stacked semiconductor packages according to a second preferred embodiment of the invention.

Referring to FIG. 3 illustrating a cross-sectional view of a module device of stacked semiconductor packages according to a second preferred embodiment of the invention. As shown in the drawing, this module device of the second embodiment is structurally similar to the module device of the above first embodiment, and differs from the first embodiment in that the chip 62 of the first semiconductor package 60 is mounted on the chip carrier 61 in a flip-chip manner and electrically connected to the chip carrier 61 by means of the first conductive elements 63 such as solder bumps.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A module device of stacked semiconductor packages, comprising:
   a first semiconductor package; and
   at least a second semiconductor package stacked on and electrically connected to the first semiconductor package;
   wherein the first semiconductor package comprises:
   a chip carrier;
   at least a chip mounted on the chip carrier;
   a plurality of first conductive elements for electrically connecting the chip to the chip carrier;
   a circuit board having a top surface and a bottom surface, and mounted above the chip;
   a plurality of second conductive elements disposed on the bottom surface of the circuit board, for supporting and electrically connecting the circuit board to the chip carrier;
   an encapsulant formed between the chip carrier and the circuit board, for encapsulating the chip and the first and second conductive elements, such that the encapsulant is flush with the top surface of the circuit board, allowing the top surface of the circuit board to be exposed to outside of the encapsulant and electrically connected with the second semiconductor package; and
   a plurality of third conductive elements for electrically connecting the first semiconductor package to an external device.

2. The module device of stacked semiconductor packages of claim 1, wherein the first conductive elements are selected from the group consisting of bonding wires and solder bumps.

3. The module device of stacked semiconductor packages of claim 1, wherein the second conductive elements are selected from the group consisting of solder balls, solder bumps and metal pins.

4. The module device of stacked semiconductor packages of claim 1, wherein the third conductive elements are solder balls.

5. The module device of stacked semiconductor packages of claim 1, wherein the second semiconductor package is a BGA (ball grid array) semiconductor package.

6. The module device of stacked semiconductor packages of claim 1, wherein the circuit board is a multi-layered circuit board.

7. The module device of stacked semiconductor packages of claim 6, wherein a plurality of electrical contacts and conductive traces are formed on the top and bottom surfaces of the circuit board, and a plurality of conductive vias are formed through the circuit board.

8. A method for fabricating a module device of stacked semiconductor packages, comprising the steps of:

(1) preparing a chip carrier and mounting at least a chip on the chip carrier, allowing the chip to be electrically connected to the chip carrier by a plurality of first conductive elements;

(2) providing a circuit board having a top surface and a bottom surface, and formed a plurality of second conductive elements on the bottom surface of the circuit board;

(3) mounting the circuit board above the chip carrier incorporated with the chip, and electrically connecting the circuit board to the chip carrier by the second conductive elements;

(4) forming an encapsulant between the chip carrier and the circuit board for encapsulating the chip and the first and second conductive elements, such that the encapsulant is flush with the top surface of the circuit board, allowing the top surface of the circuit board to be exposed to outside of the encapsulant, so as to fabricate a first semiconductor package;

(5) mounting a plurality of third conductive elements on the chip carrier, for electrically connecting the first semiconductor package to an external device; and (6) electrically connecting at least a second semiconductor package to the top surface of the circuit board of the first semiconductor package.

9. The method for fabricating a module device of stacked semiconductor packages of claim 8, wherein in the step (1), the first conductive elements are selected from the group consisting of bonding wires and solder bumps.

10. The method for fabricating a module device of stacked semiconductor packages of claim 8, wherein in the step (2), the second conductive elements are selected from the group consisting of solder balls, solder bumps and metal pins.

11. The method for fabricating a module device of stacked semiconductor packages of claim 8, wherein in the step (5), the third conductive elements are solder balls.

12. The method for fabricating a module device of stacked semiconductor packages of claim 8, wherein in the step (6), the second semiconductor package is a BGA (ball grid array) semiconductor package.

13. The method for fabricating a module device of stacked semiconductor packages of claim 8, wherein in the step (2), the circuit board is a double-layered circuit board.

14. The method for fabricating a module device of stacked semiconductor packages of claim 13, wherein in the step (2), a plurality of electrical contacts and conductive traces are formed on the top and bottom surfaces of the circuit board, and a plurality of conductive vias are formed through the circuit board.

* * * * *